(12) United States Patent
Chen et al.

(10) Patent No.: US 7,618,225 B2
(45) Date of Patent: Nov. 17, 2009

(54) SIX-BAR LINKAGE POSITIONING MECHANISM

(75) Inventors: Kuan-Chou Chen, Hsinchu (TW); Tzong-Ming Wu, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 738 days.

(21) Appl. No.: 10/994,342

(22) Filed: Nov. 23, 2004

(65) Prior Publication Data

US 2006/0060495 A1 Mar. 23, 2006

(30) Foreign Application Priority Data

Sep. 17, 2004 (TW) .............................. 93128323 A

(51) Int. Cl.
*B65D 85/00* (2006.01)

(52) U.S. Cl. ............... 414/416.03; 414/217; 414/217.1; 414/416.04; 414/917; 414/936; 74/469; 206/710

(58) Field of Classification Search ................ 414/217, 414/217.1, 416.03, 416.04, 917, 936; 74/469; 206/710

See application file for complete search history.

(56) References Cited

U.S. PATENT DOCUMENTS

| | | | | |
|---|---|---|---|---|
| 3,783,706 A | * | 1/1974 | Ogawa et al. ................. 74/469 |
| 4,786,107 A | * | 11/1988 | Crockett ..................... 297/330 |
| 4,815,912 A | * | 3/1989 | Maney et al. ............. 414/217.1 |
| 5,452,795 A | * | 9/1995 | Gallagher et al. ............ 206/711 |
| 5,890,597 A | * | 4/1999 | Fan et al. .................... 206/710 |
| 5,960,959 A | * | 10/1999 | Wu et al. .................... 206/710 |
| 6,501,070 B1 | * | 12/2002 | Bacchi et al. ................ 250/239 |
| 6,765,222 B2 | * | 7/2004 | Bacchi et al. ........... 250/559.29 |
| 7,032,758 B2 | * | 4/2006 | Pai et al. ..................... 206/710 |
| 7,102,124 B2 | * | 9/2006 | Bacchi et al. ................ 250/239 |
| 7,344,030 B2 | * | 3/2008 | Burns et al. ................. 206/710 |
| 7,360,985 B2 | * | 4/2008 | Okabe et al. ................ 414/808 |
| 2002/0006322 A1 | * | 1/2002 | Perlov et al. ................ 414/217 |
| 2006/0088406 A1 | * | 4/2006 | Miyajima et al. ........... 414/805 |
| 2006/0245849 A1 | * | 11/2006 | Yokoyama .................. 414/217 |
| 2006/0272169 A1 | * | 12/2006 | Miyajima ..................... 34/211 |

* cited by examiner

*Primary Examiner*—Michael S Lowe
(74) *Attorney, Agent, or Firm*—Rabin & Berdo, P.C.

(57) ABSTRACT

Disclosed is a six-bar linkage positioning mechanism mounted inside a clean container formed of a locating member and a four-bar linkage and a driving module which, when moved, has the slide of the driving module stopped at the base of the cleaning container and be forced to move upwards relative to a sliding way inside the locating member and to cause the driving link of the driving module to drive the four-bar linkage upwards and to further force the second link of the four-bar linkage to push workpieces in respective insertion slots in a cassette on the clean container. The six-bar linkage positioning mechanism has only one degree of freedom so that it moves workpieces horizontally in the cassette into position by means of contact at a point, preventing contamination due to friction and also improving moving stability.

6 Claims, 16 Drawing Sheets

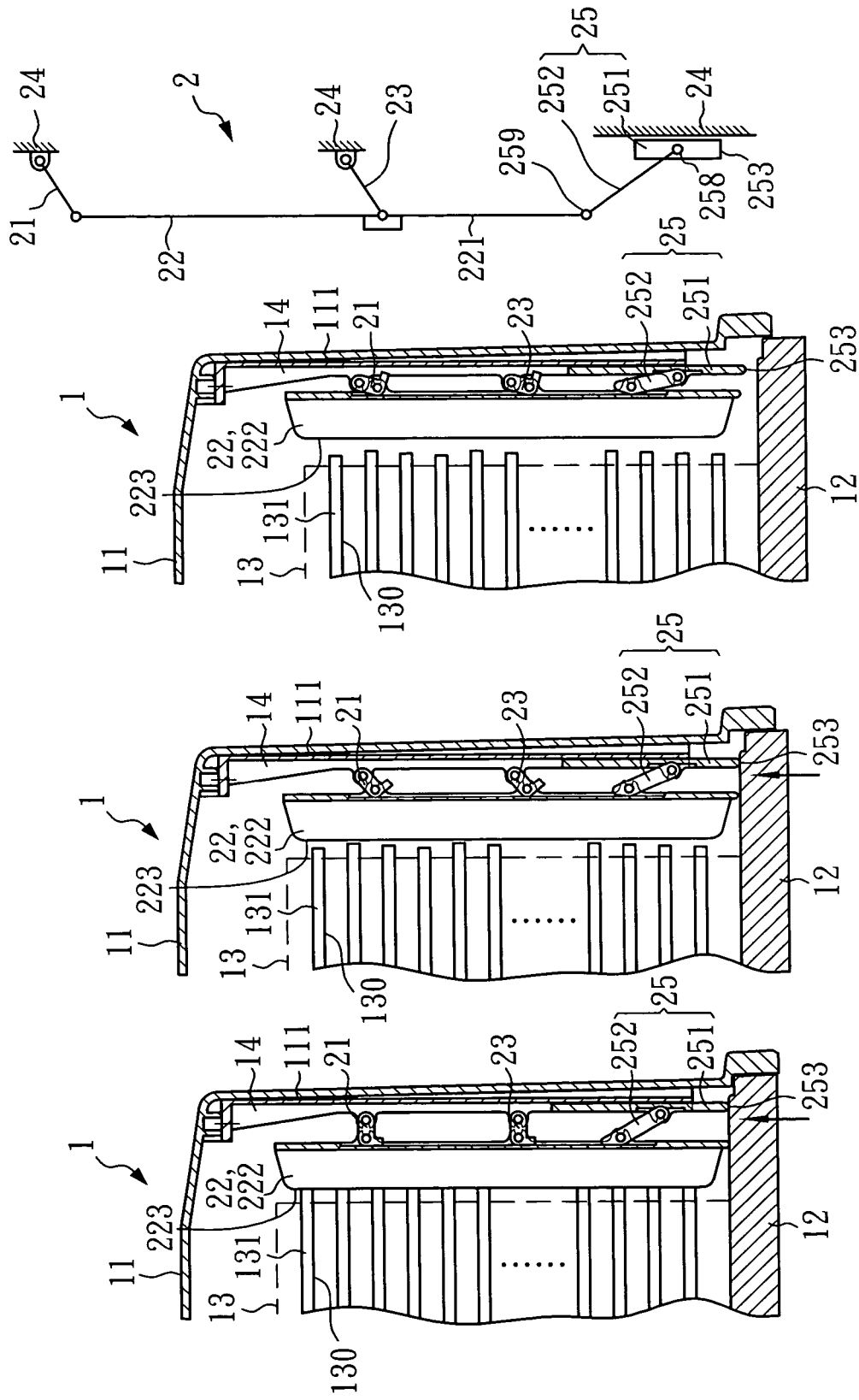

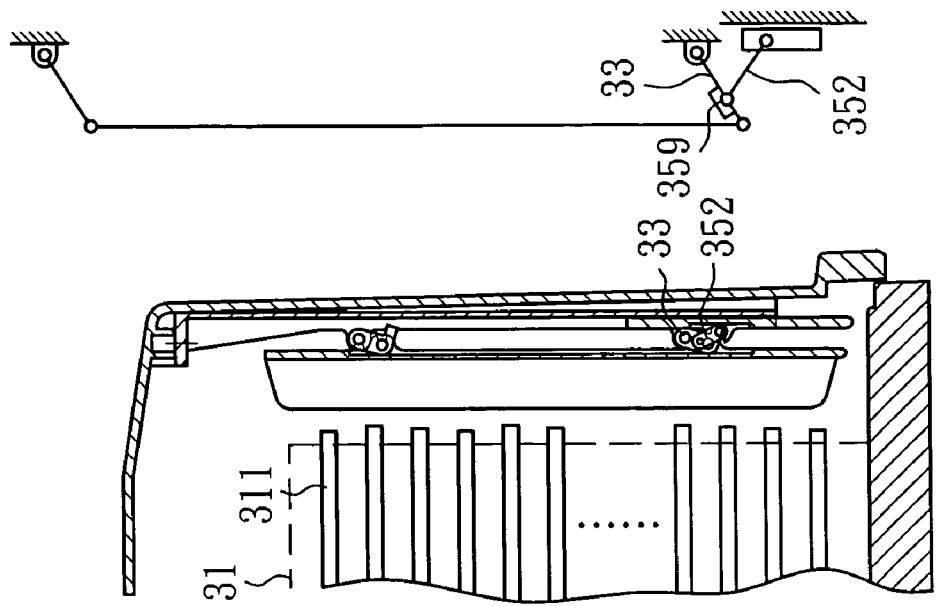
FIG. 14
FIG. 15
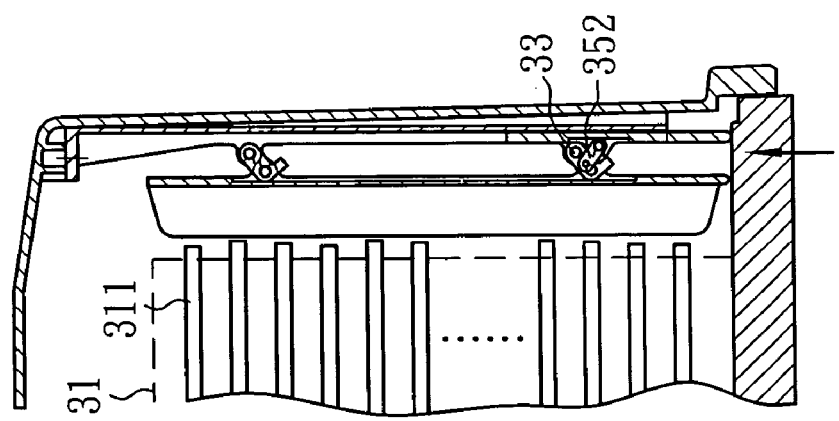
FIG. 16
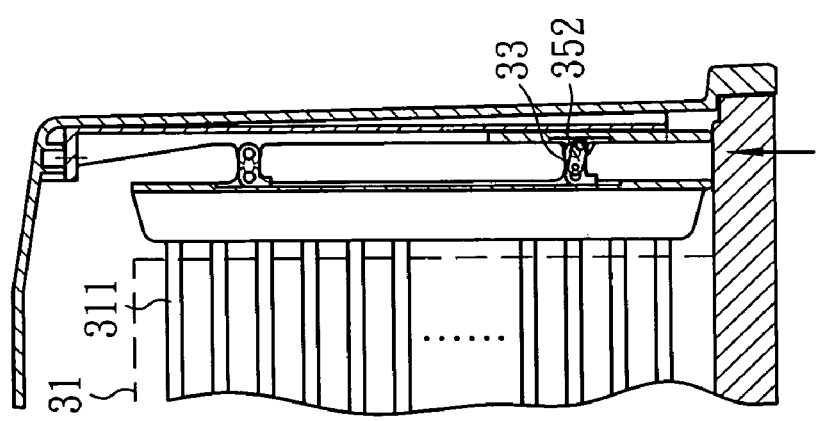
FIG. 17

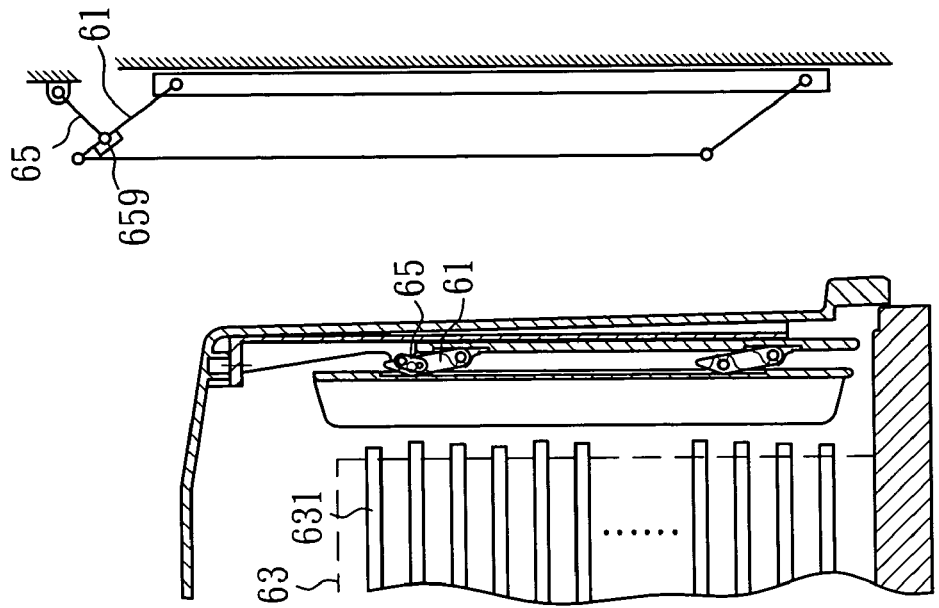
FIG. 24
FIG. 25
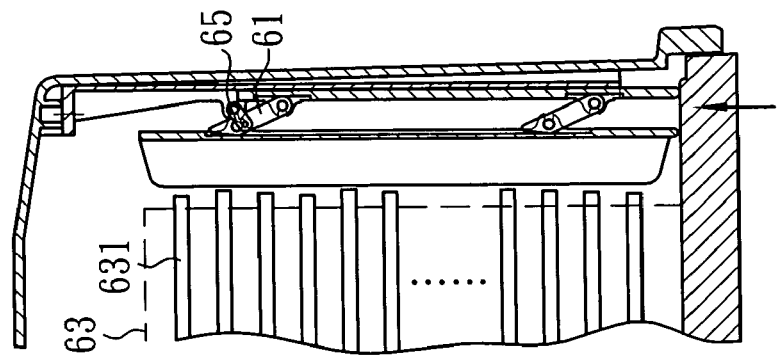
FIG. 26
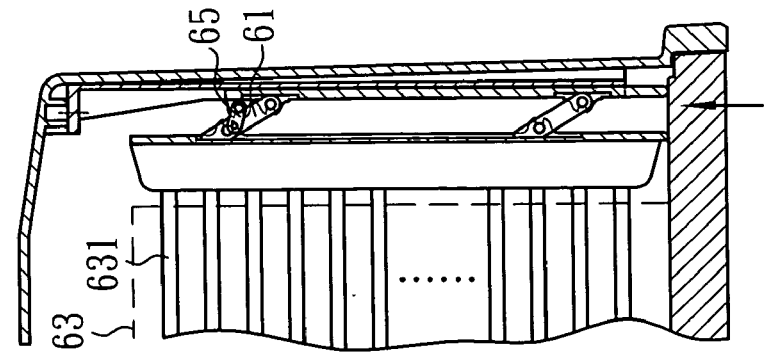
FIG. 27

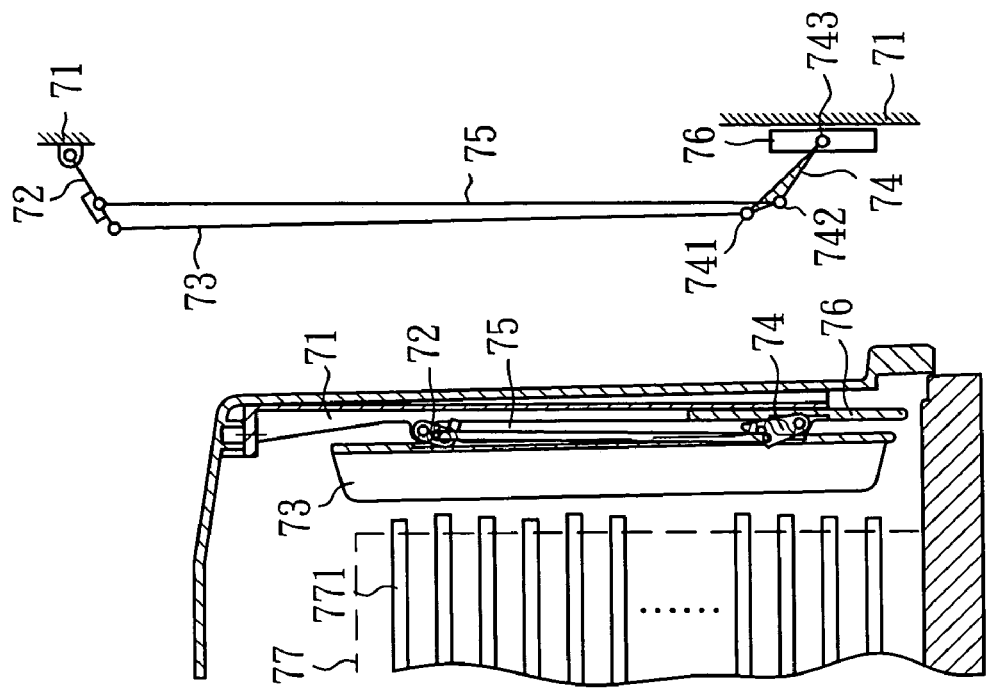
FIG. 29
FIG. 30
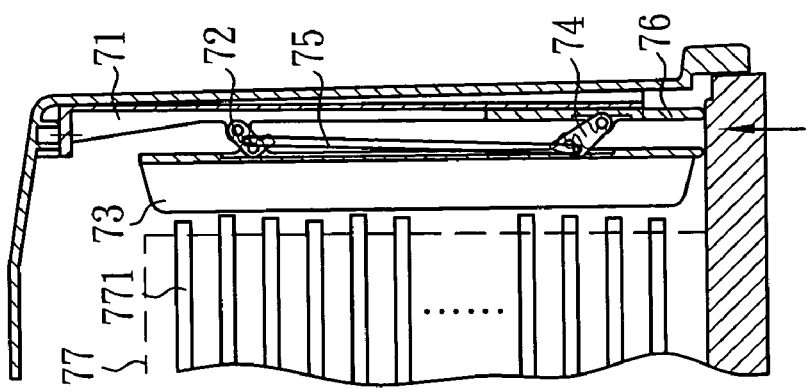
FIG. 31
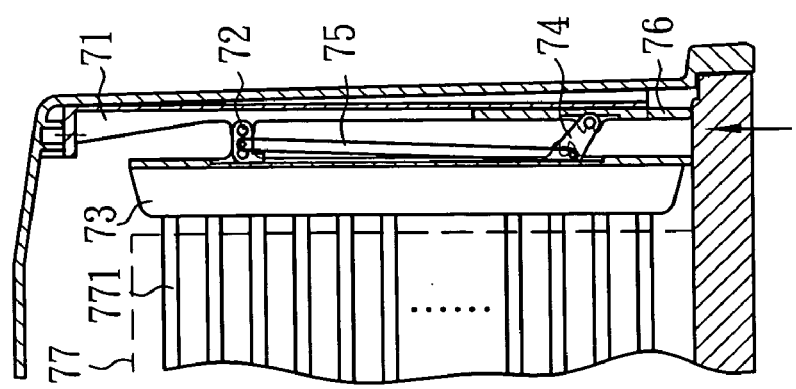
FIG. 32

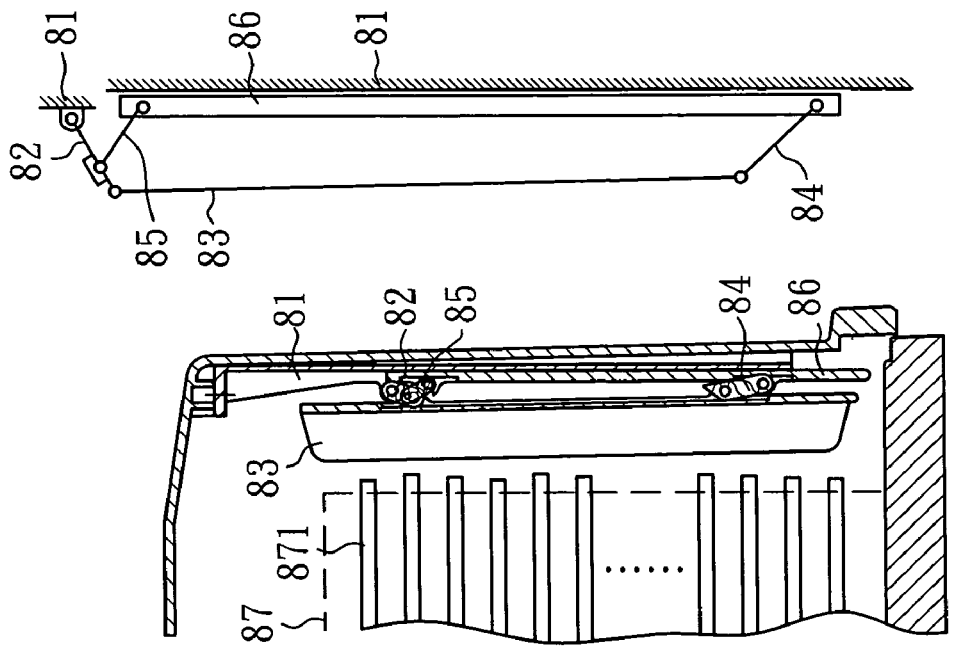
FIG. 34
FIG. 35
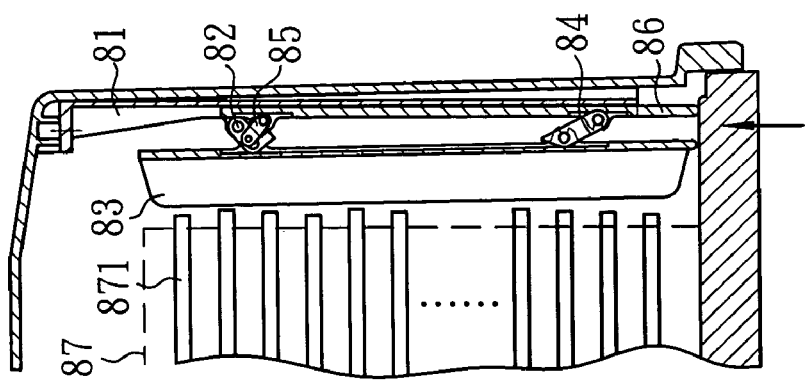
FIG. 36
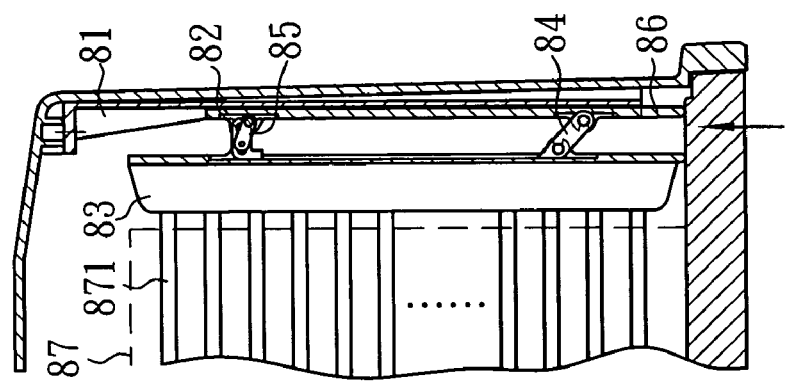
FIG. 37

SIX-BAR LINKAGE POSITIONING MECHANISM

BACKGROUND OF THE INVENTION

1. Field of the Invention

The present invention relates to a six-bar linkage positioning mechanism and more particularly, to such a six-bar linkage positioning mechanism practical for use in a clean container for holding a plurality of workpieces which vertically spaced and horizontally arranged in position without producing friction.

2. Description of Related Art

In a semiconductor foundry, wafer cassettes are used to hold semiconductor wafers in horizontal at different elevations. A wafer cassette for this purpose has bearing flanges, defining a plurality of horizontal insertion slots at different elevations for accommodating semiconductor waters. When a wafer cassette is fully loaded with semiconductor wafers, the wafer cassette is then mounted on the base of a clean container, and then a cover shell is covered on the base to protect storage wafers against contamination.

Conventionally, a wafer cassette is simply received in a wafer container after having been loaded with wafers. However, because the inside space of a conventional wafer container is much greater than a wafer cassette, storage wafers may slip inside a wafer container during its transportation. Therefore, a wafer container is provided with a retainer on the inside for holding storage wafers in position. During installation of a wafer container, a slide is stopped at the base of the wafer container to move a retainer forward, thereby causing the retainer to push storage wafers into position.

Further, in mechanisms, the so-called "degree of freedom" means the extent to which a mechanical element is freely movable without constraint. If the degree of freedom is one, it means a constrained motion mechanism, i.e., all parts of the mechanism will move in a specific direction when the mechanism is forced by an external force. If the degree of freedom is two or over two, it means a free motion mechanism, i.e., the parts of the mechanism will move in two unexpected directions when forced by an external force. In this case, it cannot accurately control the motion path and thereby unable to estimate the safeness of the motion mechanism.

In the linkage of a planar mechanisms, the degree of freedom is calculated by means of Gruebler's formula, i.e., $F=3(N-1)-2P_1$, wherein F is the degree of freedom of the linkage; N is the total number of links; $P_1$ is the total number of the motion pair of the lower pair, such as rotation pair or sliding pair.

FIG. 1 and FIG. 2 show a wafer container constructed according to the prior art. As illustrated, the wafer container 9 comprises a top cover shell 91 and a base 92. The top cover shell 91 is covered on the base 92, having a retaining mechanism 93 provided on the inside for pushing wafers 941 in the cassette 94 carried on the base 92.

As illustrated in FIG. 3, the retaining mechanism 93 is a five-bar crank and slider mechanism comprising a fixed rod member 95 (which is a locating member fixedly fastened to the inside wall of the top cover shell 91), a top link 96, a front link 97 (retainer for pushing wafers 941 into position and then holding them in position), a bottom link 98, and a sliding rod 99. This five-bar crank and slider mechanism has total four rotation pairs 951, 961, 971 and 981 and one sliding pair 991. According to the aforesaid Gruebler's formula $F=3(5-1)-2\times 5=2$, i.e., this mechanism is an unconstrained motion mechanism having two degree of freedom.

Referring to FIG. 4~FIG. 6 and FIG. 1 and FIG. 2 again, when the retaining mechanism 93 started to move, the front link 97 is tilted in one direction to push the wafers 941 upwards due to the reason of degree of freedom, as shown in FIG. 5. At this time, the wafers 941 do not receive applied force evenly, thereby causing friction between the wafers 941 and the front link 97. Friction between the wafers 941 and the front link 97 may produce particles of dust to contaminate the wafers 941.

FIG. 7 shows another linking motion of the aforesaid prior art design. Because the aforesaid five-bar crank and slider mechanism is an unconstrained motion mechanism having two degree of freedom, the front link 97 may be tilted in another direction to push the wafers 941 downwards. This motion causes the same problem.

Therefore, it is desirable to provide a six-bar linkage positioning mechanism that eliminates the aforesaid problem.

SUMMARY OF THE INVENTION

The present invention has been accomplished to provide a six-bar linkage positioning mechanism that eliminates the drawbacks of the aforesaid prior art design. The six-bar linkage positioning mechanism is mounted inside a clean container, the clean container comprises a base and a cover shell covered on the base and holds a cassette on the base, which cassette has a plurality of insertion slots horizontally arranged at different elevations for carrying a plurality of workpieces in the insertion slots. The six-bar linkage positioning mechanism comprises a locating member, a four-bar linkage, and a driving module. The locating member is fixedly fastened to an inside wall of the cover shell, and the locating member having a vertically extended sliding way. The four-bar linkage comprises a first link, a second link, a third link, and a fourth link. The fourth link is fixedly fastened to the locating member. The first link and the third link are arranged in parallel and have the same length. The second link and the fourth link are arranged in parallel and have the same length. The driving module comprises a slide and a driving link. The slide is sliding along the vertically extended sliding way of the locating member. The driving link has a first end pivoted to the slide and a second end pivoted to one of the first, second and third links of the four-bar linkage. When covering the cover shell on the base from the top, the slide will be stopped at the base and be forced to slide upwards along the vertically extended sliding way, thereby causing the driving link to drive the four-bar linkage upwards and to further force the second link to push the workpieces in the insertion slots horizontally forwards.

According to the aforesaid arrangement, the locating member, the four-bar linkage and the driving module of the six-bar linkage positioning mechanism, which is comprised of six linking elements (four links of the four-bar linkage, the driving link and the driving slide) and has six rotation pairs and one sliding pair. According to Gruebler's formula, $F=3(6-1)-2*7=1$, therefore the whole mechanism has one degree of freedom, i.e., the second link of the four-bar linkage can be forced horizontally to push every workpiece in horizontal. Therefore, this six-bar linkage positioning mechanism pushes every wafer horizontally into position by means of contact at a point to prevent contamination due to friction and to improve moving stability of the linkage.

The aforesaid second link of the four-bar linkage has an extension. The second end of the driving link is pivoted to the extension of the second link. Alternatively, the second end of the driving link can be pivoted to the third link of the four-bar linkage.

The second link of the four-bar linkage can be a retainer having at least one front thrust face for pushing the workpieces in the insertion slots horizontally forwards. Preferably, the retainer has a substantially U-shaped cross section, and two opposite lateral sides each forming one thrust face.

The fourth link of the four-bar linkage can be formed integral with a part of the locating member. The locating member can have two mounting holes respectively formed in two distal ends of a top thereof and respectively affixed to the inside wall of the cover shell with a respective screw.

In another embodiment of the present invention, the six-bar linkage positioning mechanism is mounted inside a clean container, the clean container comprises a base and a cover shell covered on the base and holds a cassette on the base, which cassette has a plurality of insertion slots horizontally arranged at different elevations for carrying a plurality of workpieces in the insertion slots. The six-bar linkage positioning mechanism according to this embodiment comprises a locating member, a four-bar linkage, and a supporting link. The locating member is fixedly fastened to an inside wall of the cover shell, having a vertically extended sliding way. The four-bar linkage comprises a first link, a second link, a third link, and a fourth link. The fourth link is sliding along the vertically extended sliding way of the locating member. The first link and the third link are arranged in parallel and have the same length. The second link and the fourth link are arranged in parallel and have the same length. The supporting link has a first end pivoted to the locating member and a second end pivoted to one of the first, second and third links of the four-bar linkage. When covering the cover shell on the base from the top, the fourth link will be stopped at the base and be forced to slide upwards along the vertically extended sliding way, thereby causing the four-bar linkage to move upwards under the constraint of the supporting link and to further force the second link to push the workpieces in the insertion slots horizontally forwards.

The six-bar linkage positioning mechanism of this embodiment has one degree of freedom for causing horizontal movement of the second link of the four-bar linkage to push every workpiece in the respective insertion slot in horizontal. Therefore, this embodiment achieves same contact at a point to prevent contamination due to friction and to improve moving stability of the linkage.

Further, the aforesaid second link of the four-bar linkage has an extension. The second end of the supporting link can be pivoted to the extension of the second link. Also, the second end of the supporting link can be pivoted to the first link of the four-bar linkage.

Further, the second link of the four-bar linkage can be a retainer having at least one front thrust face for pushing the workpieces in the insertion slots horizontally forwards. Preferably, the retainer has a substantially U-shaped cross section, and two opposite lateral sides each forming one thrust face.

Further, the fourth link of the four-bar linkage can be a driving slide axially slidably slid along the vertically extended sliding way of the locating member. The locating member can have two mounting holes respectively formed in two distal ends of a top thereof and respectively affixed to the inside wall of the cover shell with a respective screw.

BRIEF DESCRIPTION OF THE DRAWINGS

FIG. 9 is a schematic side view of the six-bar linkage positioning mechanism according to the first embodiment of the present invention.

FIG. 10 is a schematic drawing showing the motion of the six-bar linkage positioning mechanism according to the first embodiment of the present invention (I).

FIG. 11 is a schematic drawing showing the motion of the six-bar linkage positioning mechanism according to the first embodiment of the present invention (II).

FIG. 12 is a schematic drawing showing the motion of the six-bar linkage positioning mechanism according to the first embodiment of the present invention (III).

FIG. 14 is a schematic side view of the six-bar linkage positioning mechanism according to the second embodiment of the present invention.

FIG. 15 is a schematic drawing showing the motion of the six-bar linkage positioning mechanism according to the second embodiment of the present invention (I).

FIG. 16 is a schematic drawing showing the motion of the six-bar linkage positioning mechanism according to the second embodiment of the present invention (II).

FIG. 17 is a schematic drawing showing the motion of the six-bar linkage positioning mechanism according to the second embodiment of the present invention (III).

FIG. 24 is a schematic side view of the six-bar linkage positioning mechanism according to the fourth embodiment of the present invention.

FIG. 25 is a schematic drawing showing the motion of the six-bar linkage positioning mechanism according to the fourth embodiment of the present invention (I).

FIG. 26 is a schematic drawing showing the motion of the six-bar linkage positioning mechanism according to the fourth embodiment of the present invention (II).

FIG. 27 is a schematic drawing showing the motion of the six-bar linkage positioning mechanism according to the fourth embodiment of the present invention (III).

FIG. 29 is a schematic side view of the six-bar linkage positioning mechanism according to the fifth embodiment of the present invention.

FIG. 30 is a schematic drawing showing the motion of the six-bar linkage positioning mechanism according to the fifth embodiment of the present invention (I).

FIG. 31 is a schematic drawing showing the motion of the six-bar linkage positioning mechanism according to the fifth embodiment of the present invention (II).

FIG. 32 is a schematic drawing showing the motion of the six-bar linkage positioning mechanism according to the fifth embodiment of the present invention (III).

FIG. 34 is a schematic side view of the six-bar linkage positioning mechanism according to the sixth embodiment of the present invention.

FIG. 35 is a schematic drawing showing the motion of the six-bar linkage positioning mechanism according to the sixth embodiment of the present invention (I).

FIG. 36 is a schematic drawing showing the motion of the six-bar linkage positioning mechanism according to the sixth embodiment of the present invention (II).

FIG. 37 is a schematic drawing showing the motion of the six-bar linkage positioning mechanism according to the sixth embodiment of the present invention (III).

DETAILED DESCRIPTION OF THE PREFERRED EMBODIMENT

Figure 1:
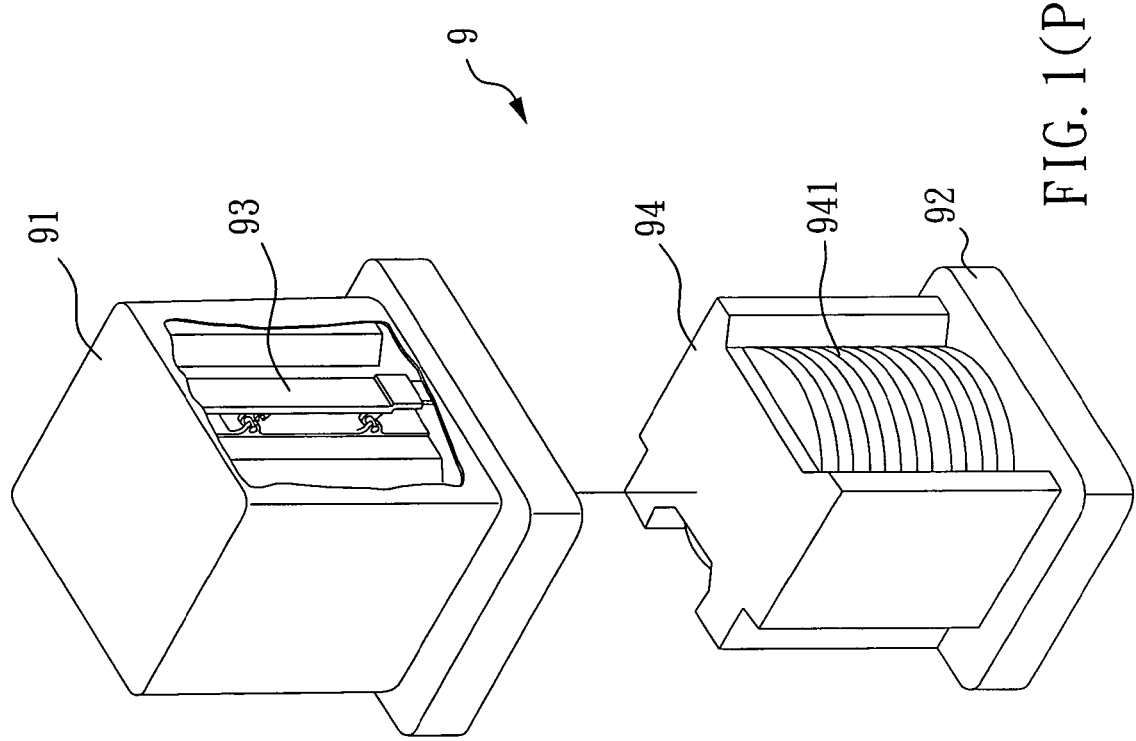
FIG. 1 is an exploded view of a semiconductor wafer container according to the prior art.
Figure 2:
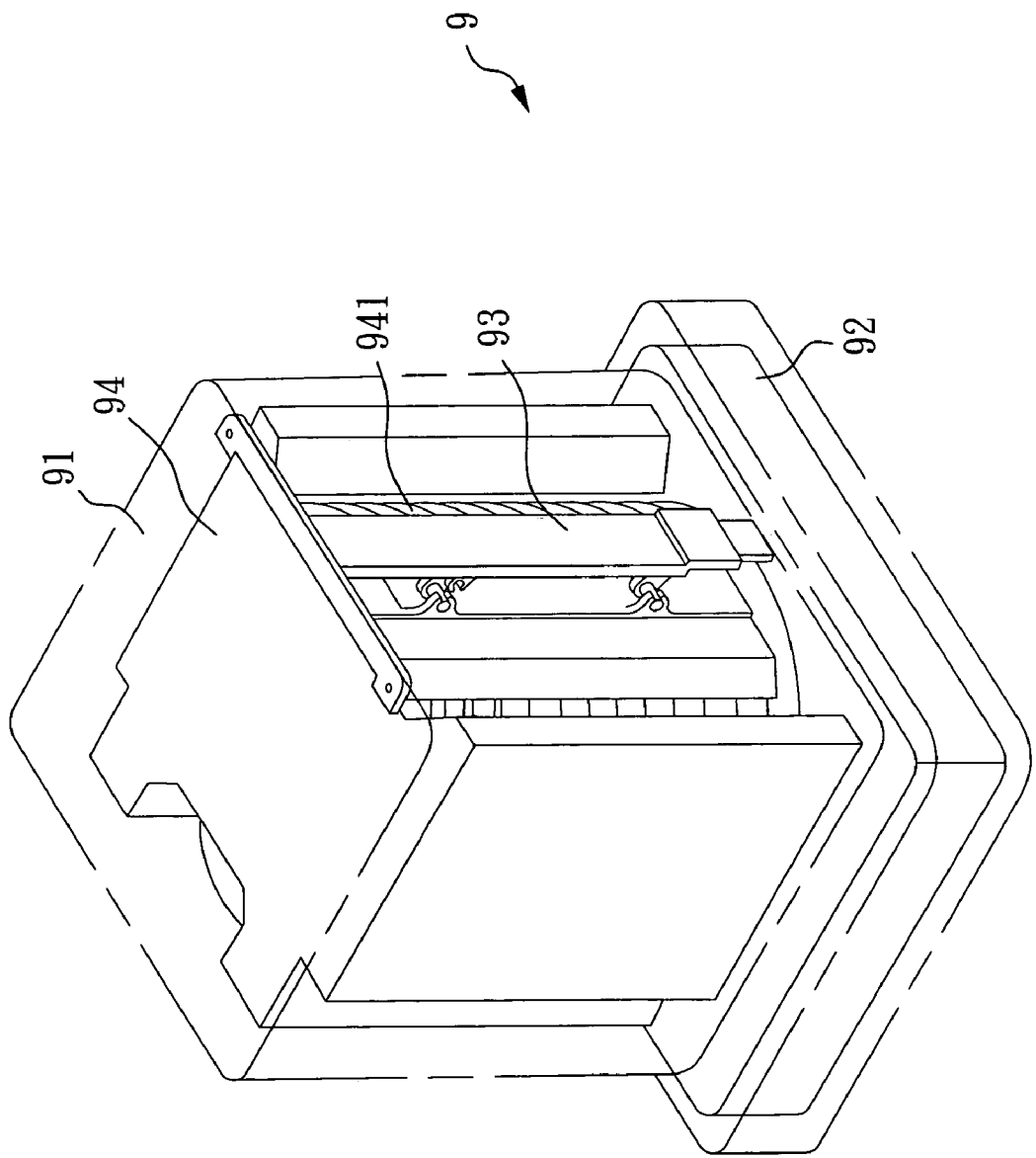
FIG. 2 is a perspective assembly view of the semiconductor wafer container according to the prior art.
Figure 3:
FIG. 3 is a schematic drawing showing the structure of the retainer used in the semiconductor wafer container according to the prior art.
Figure 4:
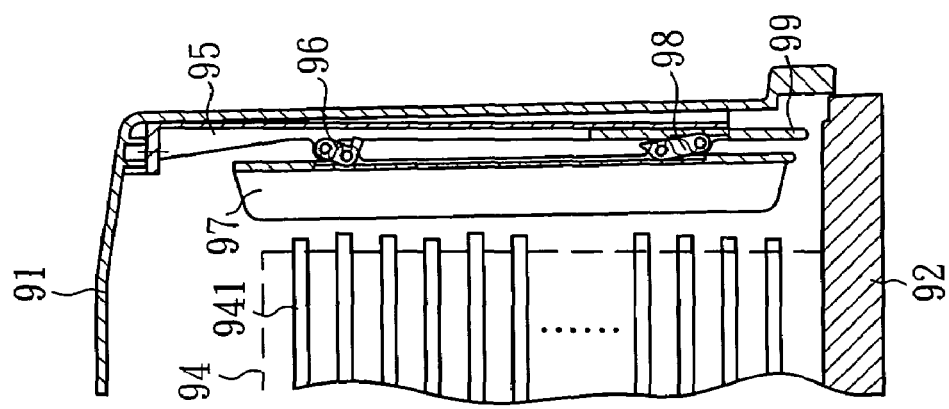
FIG. 4 is a schematic drawing showing the motion of the prior art design (I).
Figure 5:
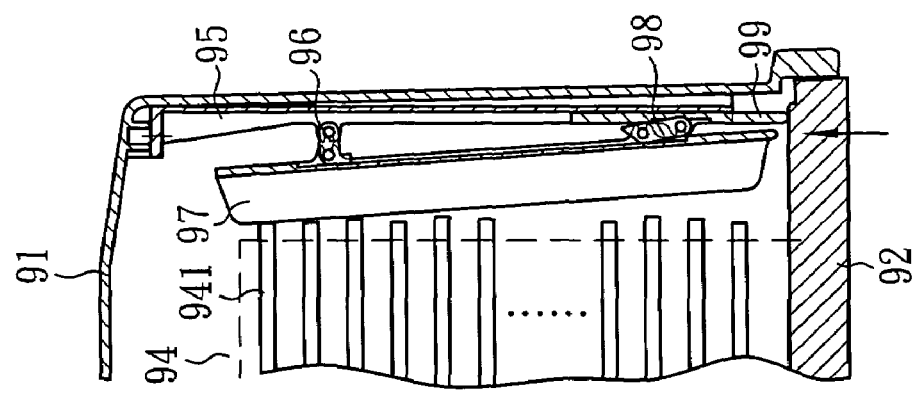
FIG. 5 is a schematic drawing showing the motion of the prior art design (II).
Figure 6:
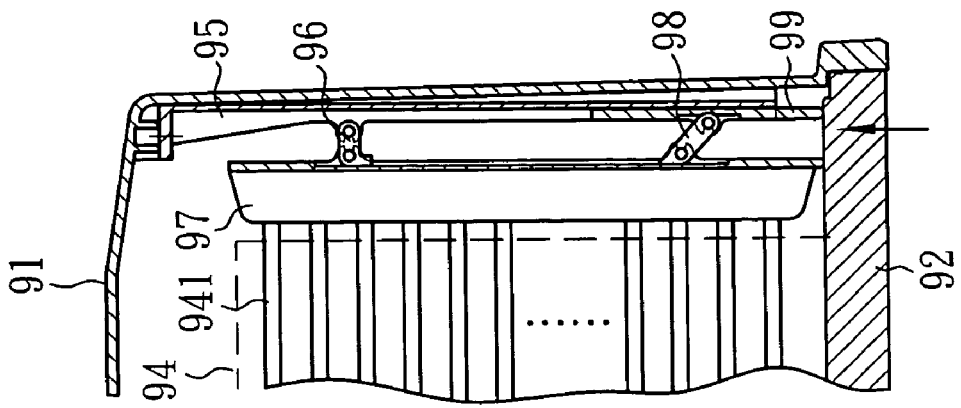
FIG. 6 is a schematic drawing showing the motion of the prior art design (III).
Figure 7:
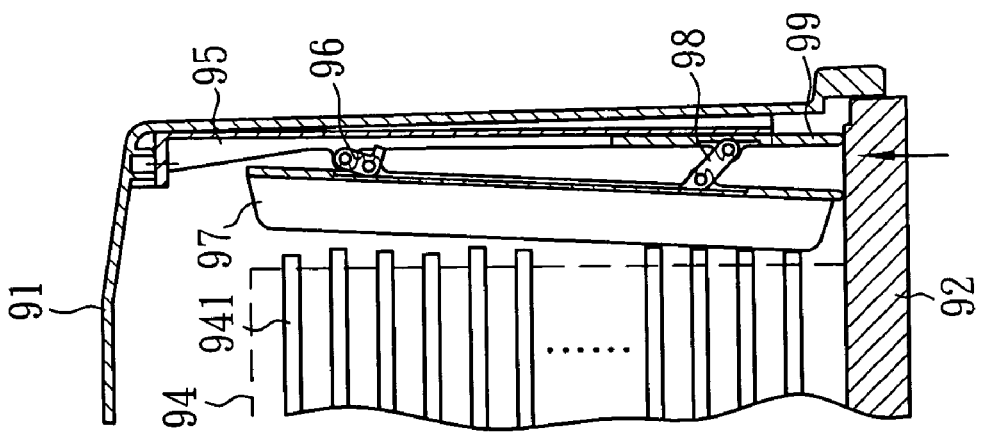
FIG. 7 is a schematic drawing showing another linking motion of the prior art design.

Referring to FIG. 8 through FIG. 12, a six-bar linkage positioning mechanism is shown constructed according to the first embodiment of the present invention and mounted inside a clean container 1. The clean container 1 comprises a base 12, and a cover shell 11 covered on the base 12. The base 12 holds a cassette 13 at the top. The cassette 13 comprises a plurality of insertion slots 130 transversely (horizontally) arranged at different elevations for carrying a plurality of workpieces 131. According to this embodiment, the workpieces 131 are wafers.

Further, the aforesaid six-bar linkage positioning mechanism comprises a locating member 14, a four-bar linkage 2, and a driving module 25. The locating member 14 is fixedly fastened to an inside wall 111 of the cover shell 11 of the clean container 1. The locating member 14 has a vertically extended sliding way 141 and two mounting holes 142 respectively formed in the two distal ends of the top thereof and respectively fixedly fastened to the inside wall 111 of the cover shell 11 of the clean container 1 with a respective screw 143.

The four-bar linkage 2 comprises a first link 21, a second link 22, a third link 23, and a fourth link 24. The fourth link 24 is fixedly to the locating member 14. According to this embodiment, the fourth link 24 forms a part of the locating member 14. The first link 21 and the third link 23 are arranged in parallel and have the same length. The second link 22 and the fourth link 24 are arranged in parallel and have the same length.

Figure 8:
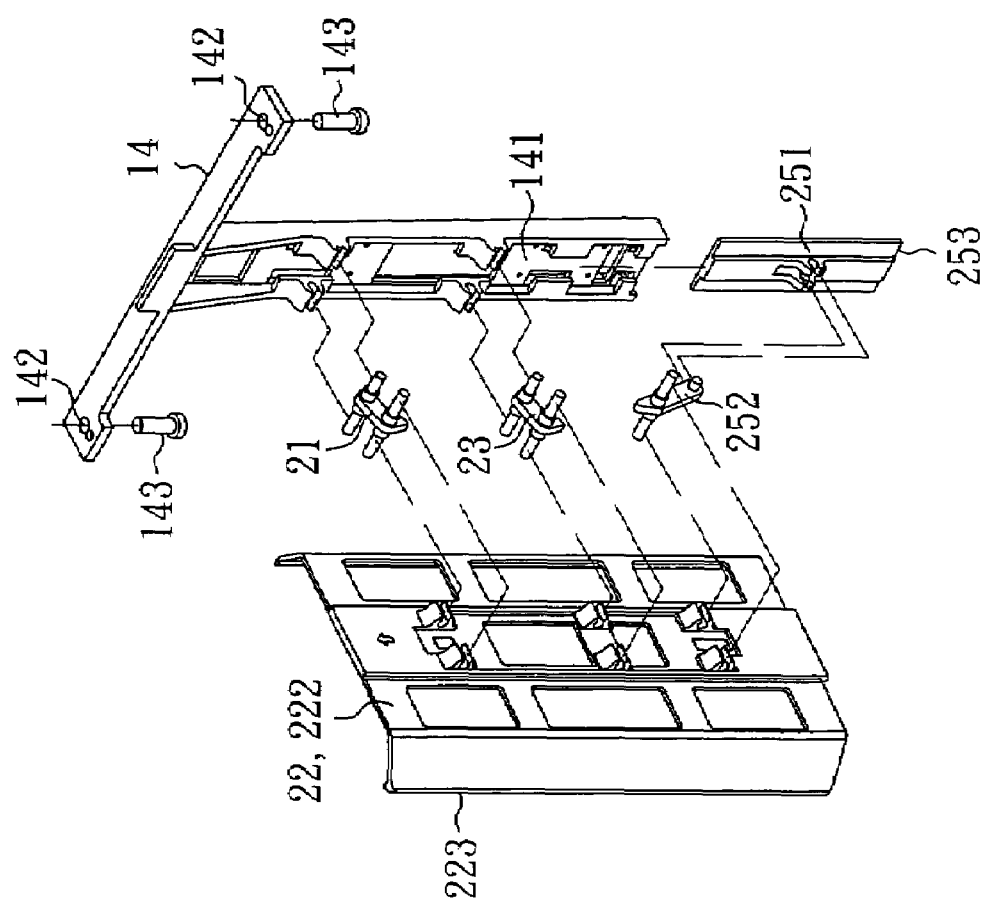
FIG. 8 is an exploded view of a six-bar linkage positioning mechanism according to the first embodiment of the present invention.
Figure 13:
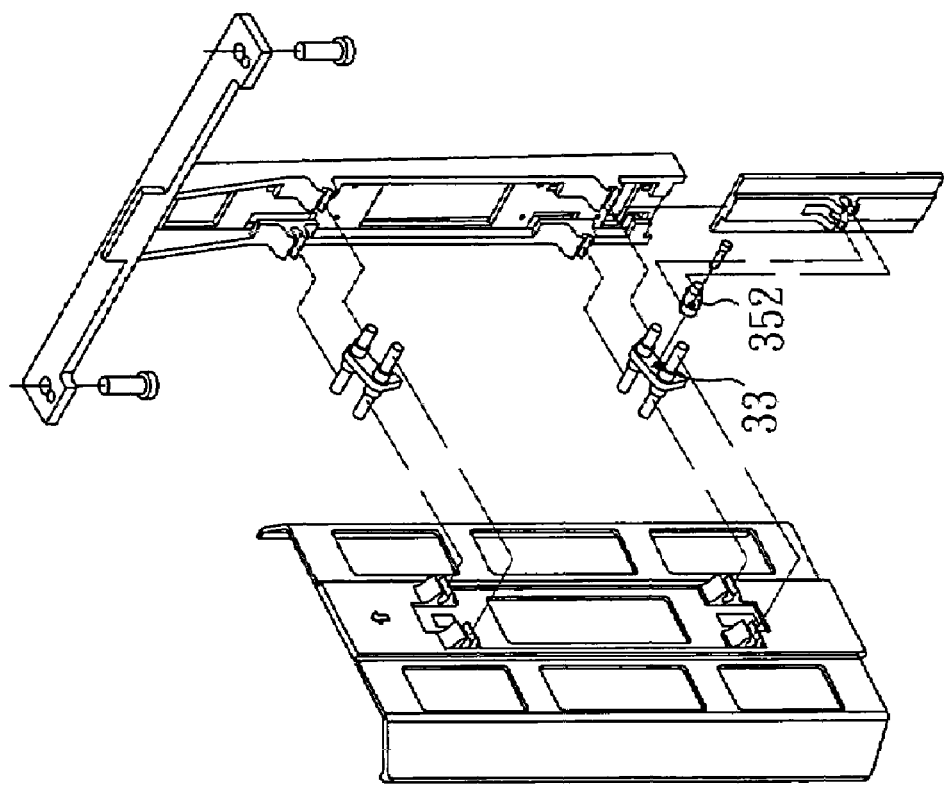
FIG. 13 is an exploded view of a six-bar linkage positioning mechanism according to the second embodiment of the present invention.
Figure 18:
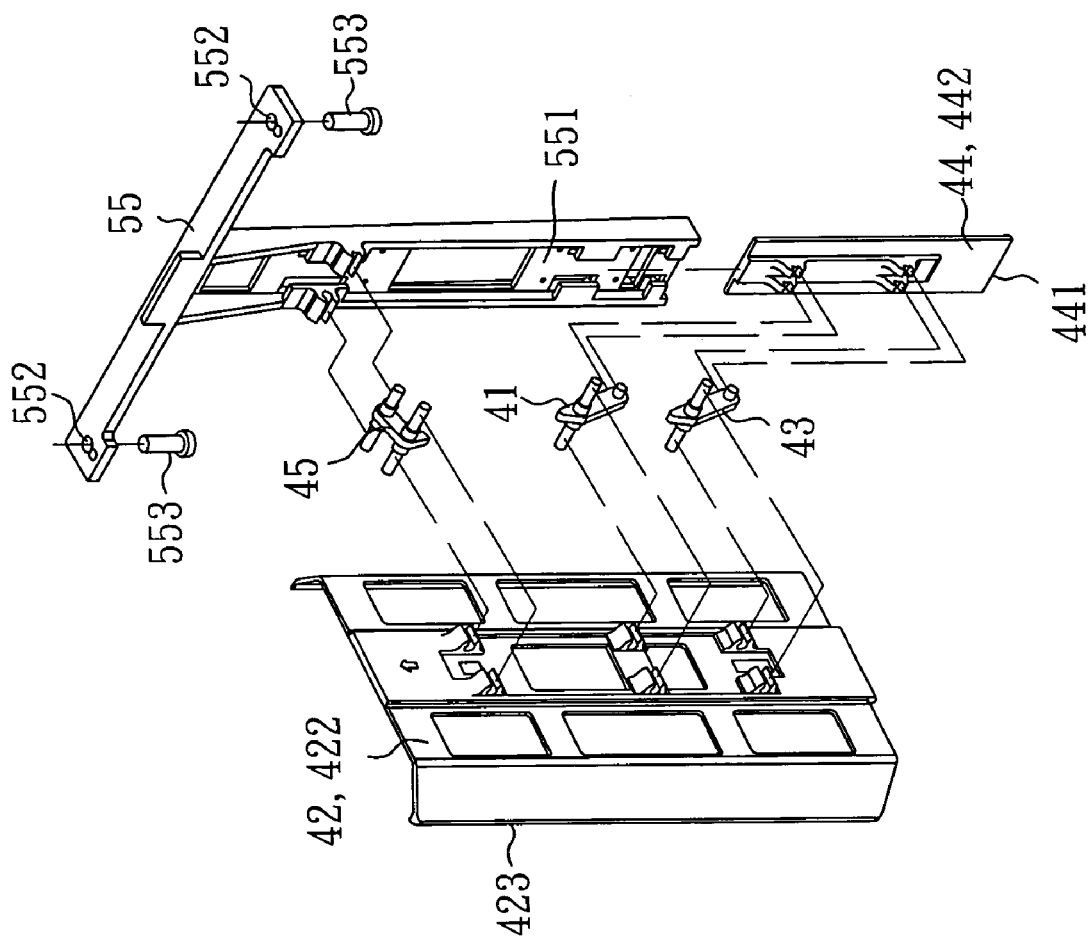
FIG. 18 is an exploded view of a six-bar linkage positioning mechanism according to the third embodiment of the present invention.
Figures 19, 20, 21, 22:
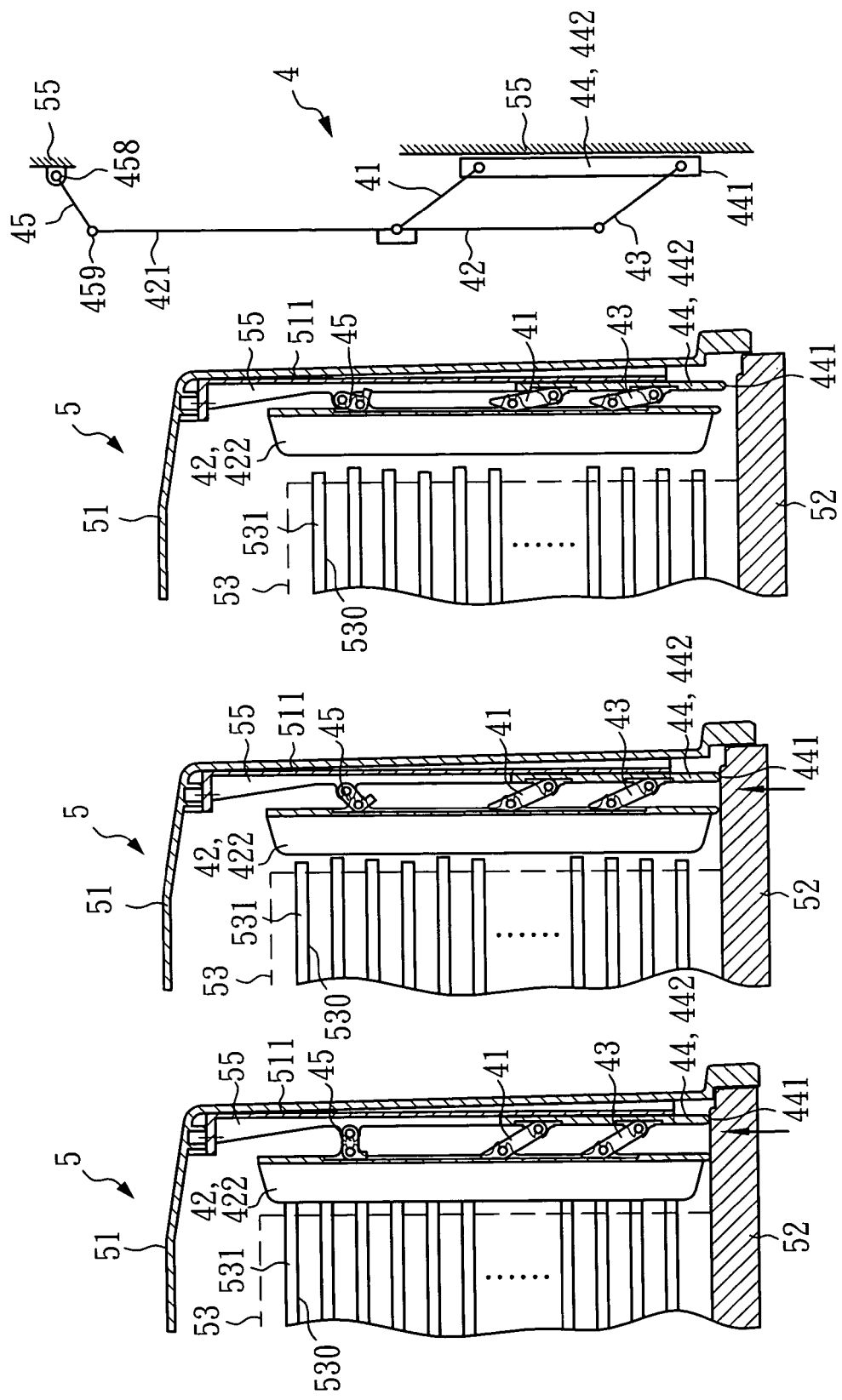
FIG. 19 is a schematic side view of the six-bar linkage positioning mechanism according to the third embodiment of the present invention.
FIG. 20 is a schematic drawing showing the motion of the six-bar linkage positioning mechanism according to the third embodiment of the present invention (I).
FIG. 21 is a schematic drawing showing the motion of the six-bar linkage positioning mechanism according to the third embodiment of the present invention (II).
FIG. 22 is a schematic drawing showing the motion of the six-bar linkage positioning mechanism according to the third embodiment of the present invention (III).
Figure 23:
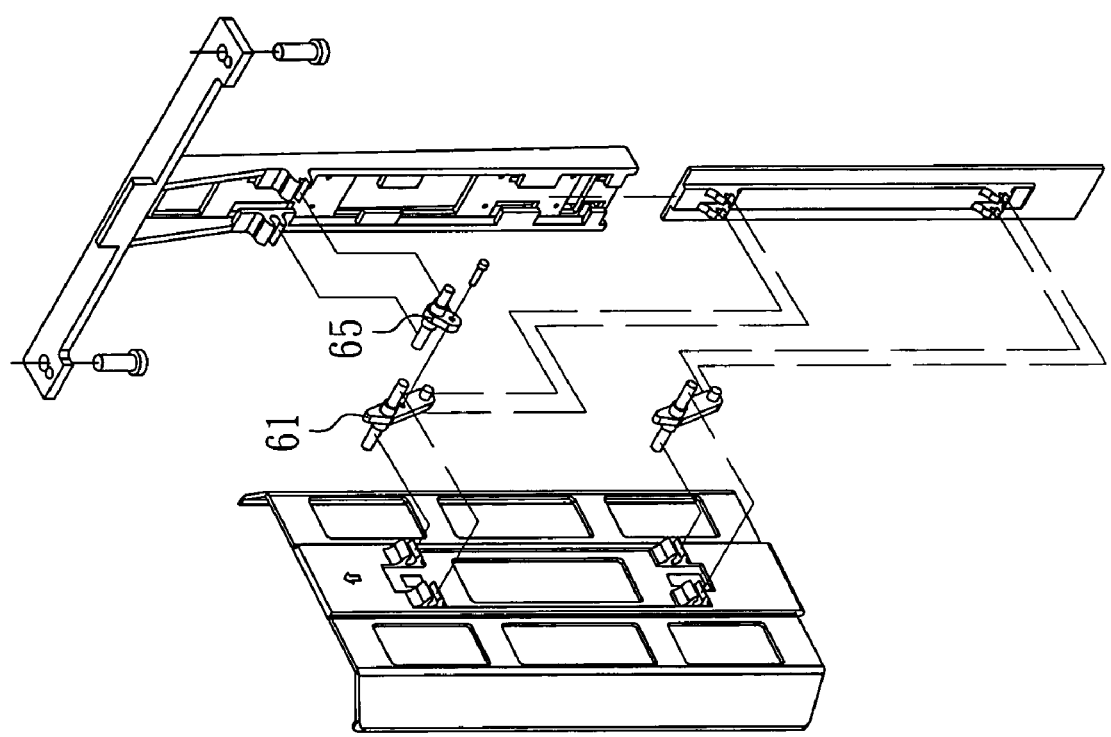
FIG. 23 is an exploded view of a six-bar linkage positioning mechanism according to the fourth embodiment of the present invention.
Figure 28:
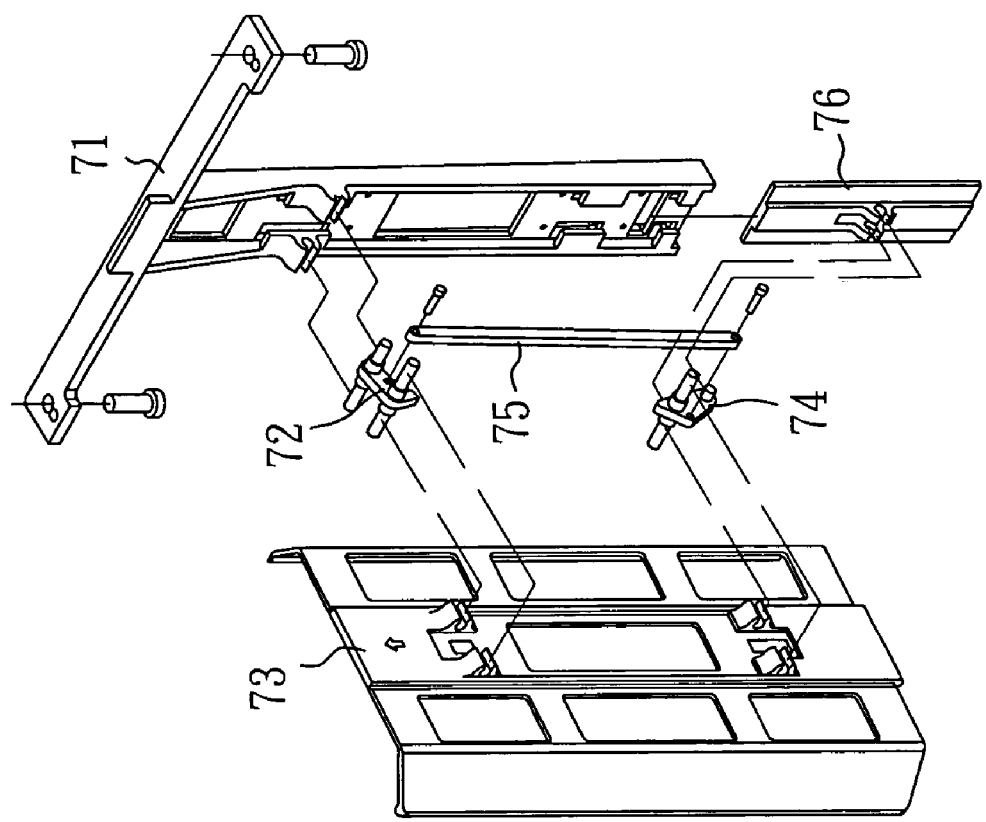
FIG. 28 is an exploded view of a six-bar linkage positioning mechanism according to the fifth embodiment of the present invention.
Figure 33:
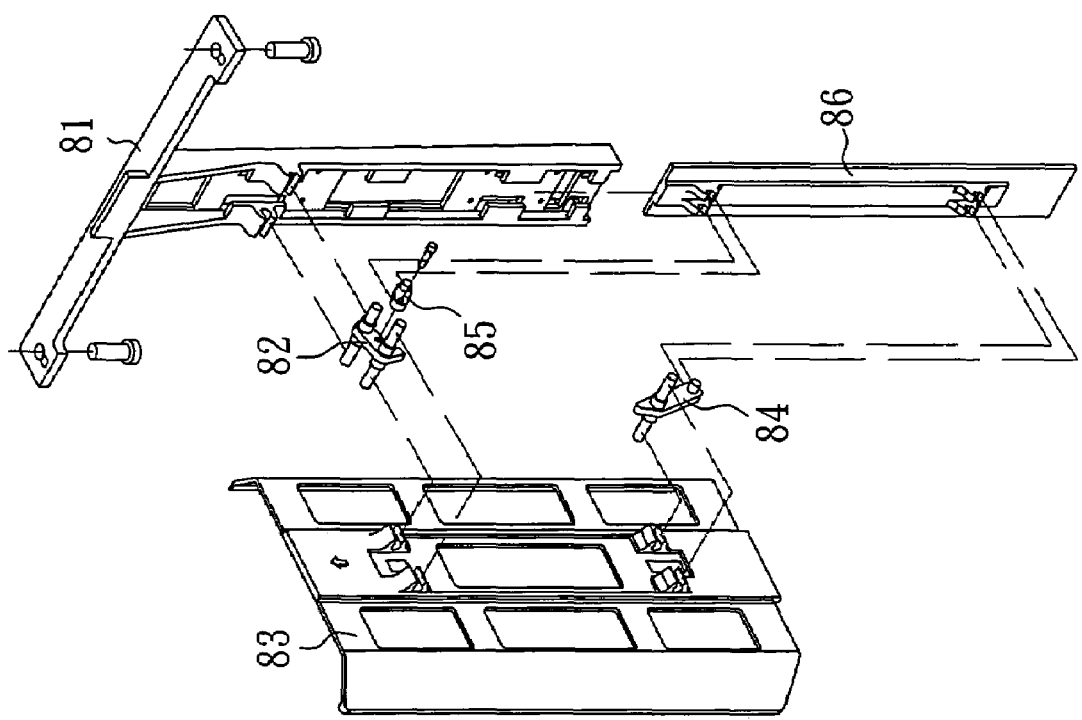
FIG. 33 is an exploded view of a six-bar linkage positioning mechanism according to the sixth embodiment of the present invention.

According to this embodiment, the second link 22 is a portion of a retainer 222 that has a substantially U-shaped cross section and a front thrust face 223 at each of the two opposite lateral sides thereof. As shown in FIG. 8 and FIG. 9, the retainer has substantially collinear first, second and third connection points, while the second connection point is between the first and third connection points. The second link 22 is the portion of the retainer between the first and second connection points. The first link 21 is connected to the retainer at the first connection point. The third link 23 is connected to the retainer at the second connection point.

The driving module 25 comprises a slide 251, and a driving link 252. The slide 251 is slid along the vertically extended sliding way 141 of the locating member 14. As shown in FIG. 8 and FIG. 9, the vertically extended sliding way 141 is substantially collinear with the fourth link 24. The driving link 252 has one end, namely, the first end 258 is pivoted to the slide 251 and the other end, namely, the second end 259 is pivoted to the second link 22 of the four-bar linkage 2. The second link 22 has an extension 221. The second end 259 of the driving link 252 is pivoted to the retainer at the third connection point.

After calculated, the aforesaid mechanism has only one degree of freedom, thereby forming a constraint mechanism. As shown in FIG. 8~FIG. 12, when covering the cover shell 11 on the base 12 vertically from the top side, the bottom side 253 of the slide 251 will be stopped at the base 12 at first, thereby causing the slide 251 to slide upwards along the vertically extended sliding way 141 and to simultaneously carry the driving link 252 upwards, and therefore the driving link 252 will drive the four-bar linkage 2 to move upwards. Due to interaction between the two pairs of parallel links of the four-bar linkage 2, the second link 22, i.e., the retainer 222 will be moved transversely (horizontally) to force the thrust faces 223 against the workpieces 131 in the cassette 13, thereby moving the workpieces 131 into position.

As indicated above, by means of the design of the locating member 14, the four-bar linkage 2 and the driving module 25, the six-bar linkage positioning mechanism is constructed to have only one degree of freedom so that the second link 22 of the four-bar linkage 2 can be moved transversely (horizontally) to push every workpiece 131 in the cassette 13 transversely (horizontally), i.e., the workpieces 131 can be moved transversely (horizontally) in the cassette 13 by means of contact at a point, preventing contamination due to friction between the second link 22 and the workpiece 131. Further, the design of the aforesaid constraint mechanism eliminates vibration, thereby improving moving stability of the six-bar linkage positioning mechanism.

FIG. 13~FIG. 17 show a six-bar linkage positioning mechanism constructed according to the second embodiment of the present invention. This embodiment is substantially similar to the aforesaid first embodiment with the exception that the second end 359 of the driving link 352 of the driving module is directly pivoted to the third link 33 of the four-bar linkage to form a constraint mechanism having one degree of freedom that is workable of pushing workpieces 311 in the cassette 31 transversely (horizontally) by means of contact at a point, preventing contamination due to friction and at the same time eliminating vibration to improve moving stability of the six-bar linkage positioning mechanism.

FIG. 18~FIG. 22 show a six-bar linkage positioning mechanism constructed according to the third embodiment of the present invention. According to this embodiment, the six-bar linkage positioning mechanism is mounted inside a clean container 5, which comprises a base 52 and a cover shell 51 covered on the base 52. The base 52 holds a cassette 53 at the top. The cassette 53 comprises a plurality of insertion slots 530 transversely (horizontally) arranged at different elevations for carrying a plurality of workpieces 531. According to this embodiment, the workpieces 531 are wafers.

According to this embodiment, the six-bar linkage positioning mechanism comprises a locating member 55, a parallel four-bar linkage 4, and a supporting link 45. The locating member 55 is fixedly fastened to an inside wall 511 of the cover shell 51 of the clean container 5. The locating member 55 has a vertically extended sliding way 551 vertically disposed on the middle, and two mounting holes 552 respectively formed in the two distal ends of the top thereof and respectively fixedly fastened to the inside wall 511 of the cover shell 51 of the clean container 5 with a respective screw 553.

The four-bar linkage 4 comprises a first link 41, a second link 42, a third link 43, and a fourth link 44. The fourth link 44 is a slide 442 longitudinally slidably slid along the vertically extended sliding way 551 of the locating member 55. The first link 41 and the third link 43 are arranged in parallel and have the same length. The second link 42 and the fourth link 44 are arranged in parallel and have the same length.

According to this embodiment, the second link 42 is a retainer 422 that has a substantially U-shaped cross section and a front thrust face 423 at each of the two opposite lateral sides thereof.

The supporting link 45 has one end, namely, the first end 458 pivoted to the locating member 55 and the other end, namely, the second end 459 pivoted to the second link 42 of the four-bar linkage 4. According to this embodiment, the second link 42 has an extension 421. The second end 459 of the supporting link 45 is pivoted to the extension 421.

After calculated, the aforesaid mechanism has only one degree of freedom, thereby forming a constraint mechanism. As shown in FIG. 18~FIG. 22, when covering the cover shell 51 on the base 52 vertically from the top side, the bottom side 441 of the slide 442 of the fourth link 44 will be stopped at the base 52 at first, thereby causing the fourth link 44 to slide upwards along the vertically extended sliding way 551 and to simultaneously carry the four-bar linkage 4 upwards under the constraint of the supporting link 45. Due to interaction between the two pairs of parallel links of the four-bar linkage 4, the second link 42, i.e., the retainer 422 will be moved transversely (horizontally) to force the thrust faces 423 to push the workpieces 531 in the cassette 53, thereby moving the workpieces 531 into position.

As indicated above, by means of the design of the locating member 55, the four-bar linkage 4 and the supporting link 45, the six-bar linkage positioning mechanism is constructed to have only one degree of freedom so that the second link 42 of the four-bar linkage 4 can be moved transversely (horizontally) to push every workpiece 531 in the cassette 53 transversely (horizontally), i.e., the workpieces 531 can be moved transversely (horizontally) in the cassette 53 by means of contact at a point, preventing contamination due to friction between the second link 42 and the workpiece 531. Further, the design of the aforesaid constraint mechanism eliminates vibration, thereby improving moving stability of the six-bar linkage positioning mechanism.

FIG. 23~FIG. 27 show a six-bar linkage positioning mechanism constructed according to the fourth embodiment of the present invention. This embodiment is substantially similar to the aforesaid third embodiment with the exception that the second end 659 of the supporting link 65 is directly pivoted to the first link 61 of the four-bar linkage to form a constraint mechanism having one degree of freedom that is workable of pushing workpieces 631 in the cassette 63 transversely (horizontally) by means of contact at a point, preventing contamination due to friction and at the same time eliminating vibration to improve moving stability of the six-bar linkage positioning mechanism.

FIG. 28~FIG. 32 show a six-bar linkage positioning mechanism constructed according to the fifth embodiment of the present invention. According to this embodiment, the six-bar linkage positioning mechanism comprises a first link 71, a second link 72, a third link 73, a fourth link 74, a fifth link 75, and a sixth link 76. The sixth link 76 is axially slidably slid along the first link 71. The fourth link 74 has three pivot points 741, 742 and 743 respectively pivoted to the third link 73, the fifth link 75 and the sixth link 76. The fifth link 75 is pivotally pivoted between the second link 72 and the fourth link 74.

When the sixth link 76 (the slide) is moved, it will carry the third link 73 (the retainer) to move workpieces 771 transversely (horizontally) in the cassette 77 by means of contact at a point. Therefore, the six-bar linkage positioning mechanism is constructed to have one degree of freedom so that the third link 73 can be moved transversely (horizontally) to push every workpiece 771 in the cassette 77 transversely (horizontally), i.e., the workpieces 771 can be moved transversely (horizontally) in the cassette 77 by means of contact at a point, preventing contamination due to friction between the third link 73 and the workpiece 771. Further, the design of the aforesaid constraint mechanism eliminates vibration, thereby improving moving stability of the six-bar linkage positioning mechanism.

FIG. 33~FIG. 37 show a six-bar linkage positioning mechanism constructed according to the sixth embodiment of the present invention. According to this embodiment, the six-bar linkage positioning mechanism comprises a first link 81, a second link 82, a third link 83, a fourth link 84, a fifth link 85, and a sixth link 86. The sixth link 86 is axially slidably slid along the first link 81, the sixth link 86 having a bottom end thereof pivoted to the fourth link 84 and a top end thereof pivotally pivoted to the second link 82 via the fifth link 85.

By means of the aforesaid design, the six-bar linkage positioning mechanism of the sixth embodiment of the present invention has one degree of freedom so that the third link 83 can be moved transversely (horizontally) to push every workpiece 871 in the cassette 87 transversely (horizontally), i.e., the workpieces 871 can be moved transversely (horizontally) in the cassette 87 by means of contact at a point, preventing contamination due to friction between the third link 83 and the workpiece 871 and also improving moving stability of the six-bar linkage positioning mechanism.

Although the present invention has been explained in relation to its preferred embodiment, it is to be understood that many other possible modifications and variations can be made without departing from the spirit and scope of the invention as hereinafter claimed.

What is claimed is:

1. A six-bar linkage positioning mechanism mounted inside a clean container, said clean container comprises a base and a cover shell covering said base, said base holding a cassette thereon, said cassette having a plurality of insertion slots horizontally arranged at different elevations for carrying a plurality of workpieces in said insertion slots, the six-bar linkage positioning mechanism comprising:

a locating member fixedly fastened to an inside wall of said cover shell, said locating member having a vertically extended sliding way;

a pushing member having substantially collinear first, second and third connection points, the second connection point being disposed between the first and third connection points;

a first link connected to the pushing member at the first connection point;

a second link defined by a portion of the pushing member between the first and second connection points;

a third link connected to the pushing member at the second connection point, the first and third links being arranged to be parallel to each other and having a same first length;

a fourth link fastened to the first and third links and comprising a portion of said locating member disposed between connection points of the first and third links, the fourth link being substantially collinear with the vertically extended sliding way, said second link and said fourth link being arranged to be parallel to each other and having a same second length; and a driving module comprising a slide and a driving link, said slide being slidable along the vertically extended sliding way of said locating member, said driving link having a first end pivoted to said slide and a second end pivoted to the pushing member at the third connection point;

wherein when said base is covered with said cover shell from a top thereof, said slide will be stopped at said base and be forced to slide upwards along said vertically extended sliding way, thereby causing said driving link to drive the pushing member upwards and to further force said pushing member to push said workpieces in said insertion slots horizontally forwards, the pushing member moving while being constantly parallel to the fourth link.

2. The six-bar linkage positioning mechanism as claimed in claim 1, wherein the second end of said driving link is pivoted to the third link of said four-bar linkage.

3. The six-bar linkage positioning mechanism as claimed in claim 1, wherein the pushing member is a retainer having at least one front thrust face for pushing said workpieces in said insertion slots horizontally forwards.

4. The six-bar linkage positioning mechanism as claimed in claim 3, wherein said retainer has a substantially U-shaped cross section, and two opposite lateral sides each forming a respective one of said at least one thrust face.

5. The six-bar linkage positioning mechanism as claimed in claim 1, wherein the fourth link forms a part of said locating member.

6. The six-bar linkage positioning mechanism as claimed in claim 1, wherein said locating member has two mounting holes respectively formed in two distal ends of a top thereof and respectively affixed to said inside wall of said cover shell with a respective screw.

* * * * *